(12) United States Patent
Sheng et al.

(10) Patent No.: US 11,499,231 B2
(45) Date of Patent: Nov. 15, 2022

(54) LID STACK FOR HIGH FREQUENCY PROCESSING

(71) Applicant: Applied Materials, Inc., Santa Clara, CA (US)

(72) Inventors: Shuran Sheng, Saratoga, CA (US); Lin Zhang, San Jose, CA (US); Joseph C. Werner, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/844,089

(22) Filed: Apr. 9, 2020

(65) Prior Publication Data

US 2021/0317578 A1 Oct. 14, 2021

(51) Int. Cl.
 *C23C 16/50* (2006.01)
 *H01J 37/32* (2006.01)
 (Continued)

(52) U.S. Cl.
 CPC .......... *C23C 16/50* (2013.01); *C23C 16/4583* (2013.01); *H01J 37/3244* (2013.01);
 (Continued)

(58) Field of Classification Search
 CPC ..... C23C 16/50; C23C 16/452; C23C 16/505; C23C 16/4583; C23C 16/4584;
 (Continued)

(56) References Cited

U.S. PATENT DOCUMENTS 4,872,947 A * 10/1989 Wang ..................... C23C 16/402
 216/38
6,204,607 B1 * 3/2001 Ellingboe ............. H01J 37/321
 118/723 I
(Continued)

FOREIGN PATENT DOCUMENTS

CN 109690728 A 4/2019
KR 100731994 B1 6/2007
(Continued)

OTHER PUBLICATIONS

International Search Report and Written Opinion dated Jul. 21, 2021 in International Patent Application No. PCT/US2021/025366, 8 pages.

*Primary Examiner* — Yuechuan Yu
(74) *Attorney, Agent, or Firm* — Kilpatrick Townsend & Stockton LLP

(57) ABSTRACT

Exemplary semiconductor processing chambers may include a substrate support positioned within a processing region of the semiconductor processing chamber. The chamber may include a lid plate. The chamber may include a gasbox positioned between the lid plate and the substrate support. The gasbox may be characterized by a first surface and a second surface opposite the first surface. The gasbox may define a central aperture. The gasbox may define an annular channel in the first surface of the gasbox extending about the central aperture through the gasbox. The gasbox may include an annular cover extending across the annular channel defined in the first surface of the gasbox. The
(Continued)

chamber may include a blocker plate positioned between the gasbox and the substrate support. The chamber may include a ferrite block positioned between the lid plate and the blocker plate.

20 Claims, 5 Drawing Sheets

(51) Int. Cl.

| | | |
|---|---|---|
| H01L 21/67 | (2006.01) | |
| C23C 16/458 | (2006.01) | |
| H01L 21/02 | (2006.01) | |
| H01L 27/11551 | (2017.01) | |
| H01L 27/11578 | (2017.01) | |
| H01L 21/687 | (2006.01) | |

(52) U.S. Cl.
CPC .. *H01J 37/32724* (2013.01); *H01J 37/32899* (2013.01); *H01L 21/67017* (2013.01); *H01L 21/67167* (2013.01); *H01J 2237/002* (2013.01); *H01J 2237/3321* (2013.01); *H01L 21/022* (2013.01); *H01L 21/0217* (2013.01); *H01L 21/02164* (2013.01); *H01L 21/02274* (2013.01); *H01L 21/68742* (2013.01); *H01L 27/11551* (2013.01); *H01L 27/11578* (2013.01)

(58) Field of Classification Search
CPC ......... H01L 21/67167; H01L 21/67017; H01L 21/6719; H01L 27/11582; H01L 27/11551; H01L 21/0217; H01L 27/11578; H01L 21/022; H01L 21/02164; H01L 27/11556; H01L 21/68742; H01L 21/02274; H01J 37/3244; H01J 37/32899; H01J 37/32724; H01J 2237/002; H01J 2237/3221
See application file for complete search history.

(56) References Cited

U.S. PATENT DOCUMENTS

| | | | |
|---|---|---|---|
| 6,387,207 | B1 | 5/2002 | Janakiraman et al. |
| 6,418,874 | B1* | 7/2002 | Cox .................. H01J 37/32009 118/723 I |
| 2013/0034666 | A1* | 2/2013 | Liang ................ H01J 37/32449 427/569 |
| 2017/0194128 | A1* | 7/2017 | Lai ........................ C23C 16/509 |
| 2019/0252161 | A1 | 8/2019 | Sheng et al. |

FOREIGN PATENT DOCUMENTS

| | | |
|---|---|---|
| KR | 2008-0037917 A | 5/2008 |
| TW | 492045 B | 6/2002 |
| TW | 201024455 A | 7/2010 |
| TW | 201145350 A | 12/2011 |

\* cited by examiner

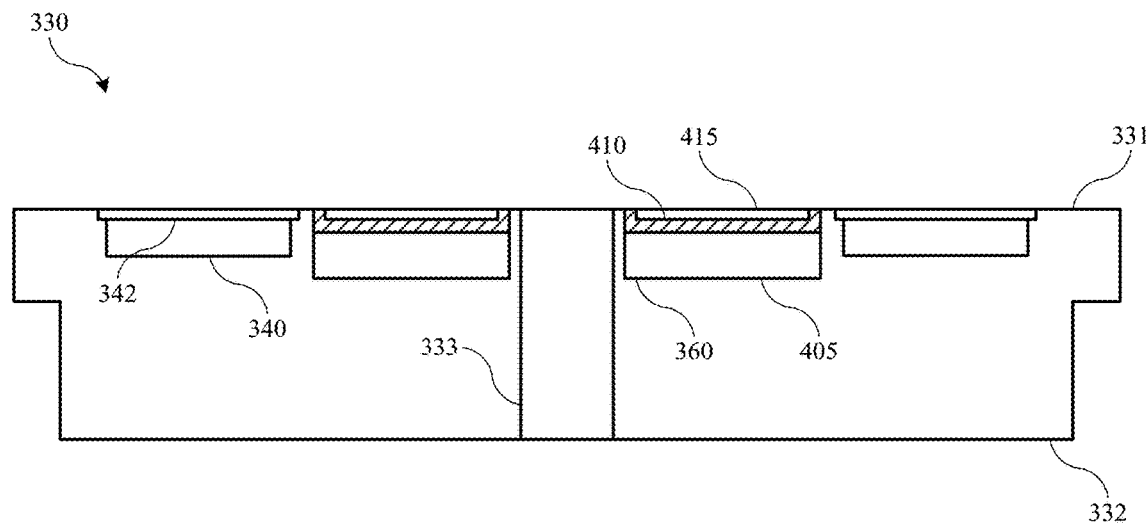
*FIG. 4*
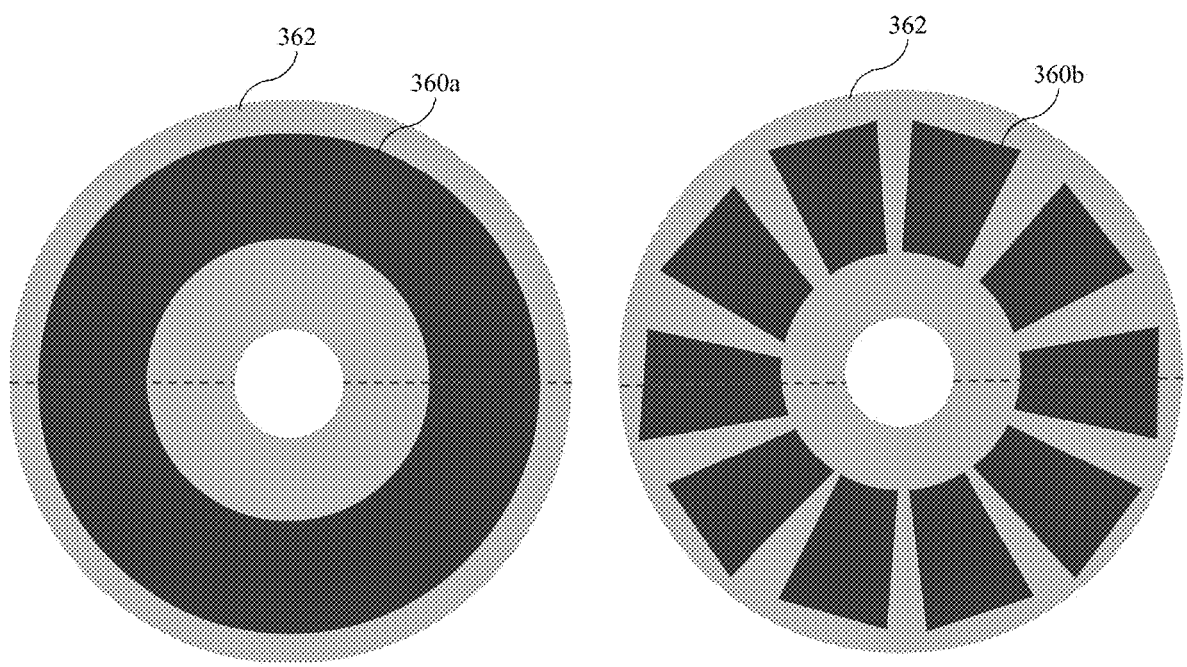
*FIG. 5A*  *FIG. 5B*

LID STACK FOR HIGH FREQUENCY PROCESSING

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. The processing gases may be plasma enhanced to increase the reactivity of the effluents produced. However, depending on aspects of the plasma enhancement, the materials may not deposit uniformly on the substrate.

Thus, there is a need for improved systems and methods that can be used to produce high quality devices and structures. These and other needs are addressed by the present technology.

SUMMARY

Exemplary semiconductor processing chambers may include a substrate support positioned within a processing region of the semiconductor processing chamber. The chamber may include a lid plate. The chamber may include a gasbox positioned between the lid plate and the substrate support. The gasbox may be characterized by a first surface and a second surface opposite the first surface. The gasbox may define a central aperture. The gasbox may define an annular channel in the first surface of the gasbox extending about the central aperture through the gasbox. The gasbox may define a recessed ledge in the first surface of the gasbox extending about the annular channel. The gasbox may include an annular cover seated on the recessed ledge and extending across the annular channel defined in the first surface of the gasbox. The chamber may include a blocker plate positioned between the gasbox and the substrate support. The chamber may include a ferrite block positioned between the lid plate and the blocker plate. The chamber may include a faceplate positioned between the blocker plate and the substrate support.

In some embodiments, the ferrite block may be characterized by an annular shape extending about the central aperture of the gasbox. The chamber may include an insulator positioned between the gasbox and the lid plate. The insulator may define a central aperture axially aligned with the central aperture defined through the gasbox, and the ferrite block may extend about the insulator. The ferrite block may be or include a plurality of blocks extending about the gasbox. The ferrite block may be disposed within a dielectric material. The dielectric material may be characterized by a dielectric constant below or about 3.7. The dielectric material may be or include polytetrafluoroethylene or polyether ether ketone. The gasbox may define a second annular channel within the gasbox, and the ferrite block may be seated within the second annular channel. A dielectric spacer may be positioned on the ferrite block seated within the second annular channel. The dielectric spacer may define a recess within the dielectric spacer, and a cover may be seated within the recess within the dielectric spacer. The dielectric spacer may create a vertical spacing between the cover and the ferrite block, and the dielectric spacer may create a radial gap between the cover and the gasbox.

Some embodiments of the present technology may encompass semiconductor processing chambers including a substrate support positioned within a processing region of the semiconductor processing chamber. The chambers may include a lid plate. The chambers may include a gasbox positioned between the lid plate and the substrate support. The gasbox may be characterized by a first surface and a second surface opposite the first surface. The gasbox may define a central aperture. The gasbox may define an annular channel in the first surface of the gasbox extending about the central aperture through the gasbox. The gasbox may define a recessed ledge in the first surface of the gasbox extending about the annular channel. The gasbox may include an annular cover seated on the recessed ledge and extending across the annular channel defined in the first surface of the gasbox. The chambers may include a ferrite block positioned between the lid plate and the gasbox. The chambers may include a blocker plate positioned between the gasbox and the substrate support. The chambers may include a faceplate positioned between the blocker plate and the substrate support.

In some embodiments, the ferrite block may be characterized by an annular shape extending about the central aperture of the gasbox. The chambers may include an insulator positioned between the gasbox and the lid plate. The insulator may define a central aperture axially aligned with the central aperture defined through the gasbox, and the ferrite block may extend about the insulator. The ferrite block may include a plurality of blocks extending about the gasbox. The ferrite block may be disposed within a dielectric material. The dielectric material may be or include polytetrafluoroethylene or polyether ether ketone.

Some embodiments of the present technology may encompass semiconductor processing chamber gasboxes. The gasboxes may be characterized by a first surface and a second surface opposite the first surface. The gasboxes may define a central aperture. The gasbox may define an annular channel in the first surface of the gasbox extending about the central aperture through the gasbox. The gasboxes may include a ferrite block seated within the annular channel. The gasboxes may include a dielectric spacer seated on the ferrite block. The gasboxes may include a cover seated on the dielectric spacer.

In some embodiments, the dielectric spacer may define a recess in a surface of the dielectric spacer opposite a surface in contact with the ferrite block. The cover may be seated within the recess. The dielectric spacer may create a vertical spacing between the cover and the ferrite block, and the dielectric spacer may create a radial gap between the cover and the gasbox. The ferrite block may include a plurality of blocks extending about the annular channel in the first surface of the gasbox.

Such technology may provide numerous benefits over conventional systems and techniques. For example, embodiments of the present technology may allow higher frequency power to be used in plasma processing. Additionally, the chambers may improve uniformity of deposition based on control of standing wave effects produced by high-frequency plasma. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 4 shows a schematic cross-sectional view of an exemplary gasbox according to some embodiments of the present technology.

FIG. 5A shows a schematic top view of an exemplary ferrite block according to some embodiments of the present technology.

FIG. 5B shows a schematic top view of an exemplary ferrite block according to some embodiments of the present technology.

Figure 1:
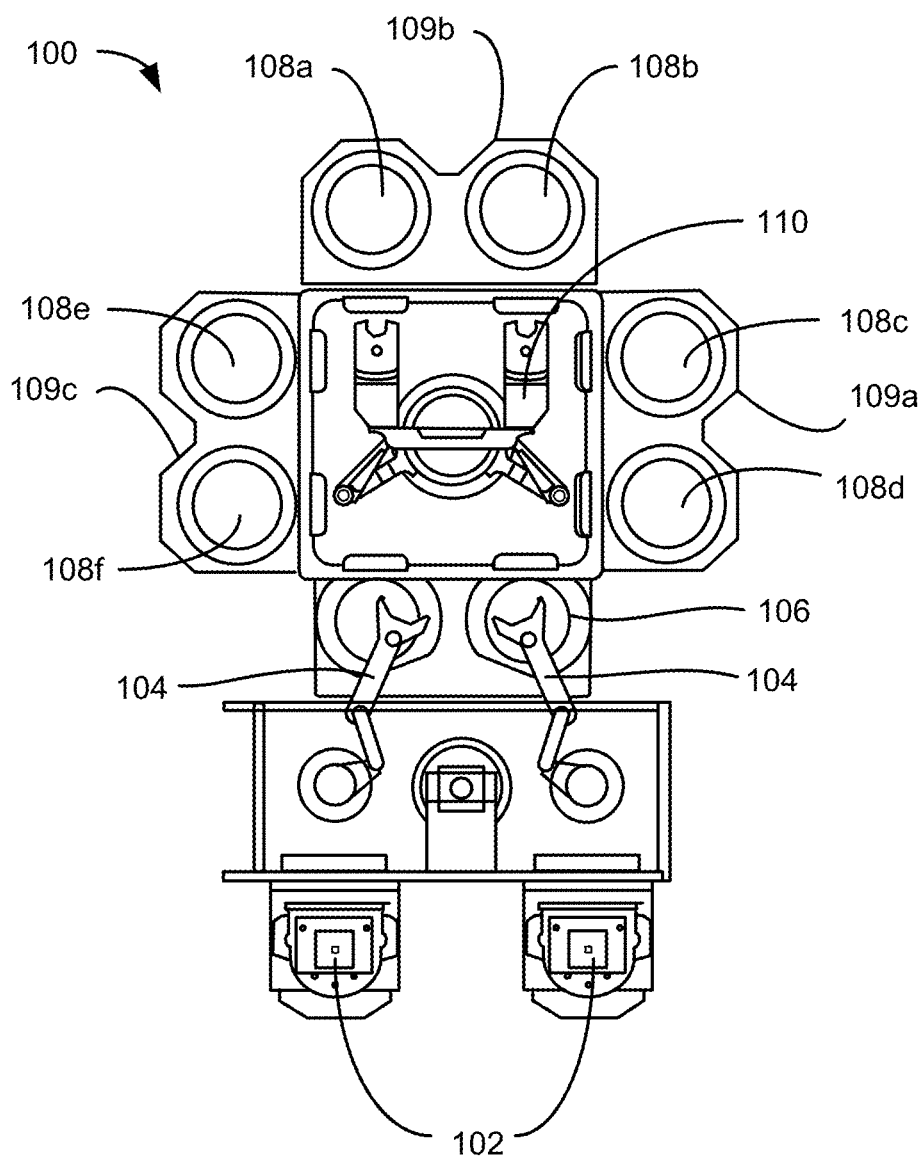
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, in 3D NAND fabrication, a set of material layers may be initially deposited before individual memory cells are formed within the structure. The structure may include alternating layers of placeholder materials and dielectric materials. Formation of these layers may occur within a single processing chamber where purging operations performed between material formation may protect the integrity of each layer being formed.

As technology continues to scale, the number of memory cells may be increased by increasing the number of pairs of layers initially formed. For example, more than 20, more than 50, more than 100, or more than 150 pairs of layers of materials may initially be deposited on a substrate. This amount of processing to form the initially deposited layers may be time consuming, which may increase fabrication costs. Much plasma processing is performed at about 13 MHz, which provides a certain rate of deposition for each layer. Increasing to a very-high frequency ("VHF") process, such as greater than or about 27 MHz, greater than or about 40 MHz, or more, may increase the plasma density, which may increase the rate of deposition. However, VHF processing may reduce uniformity of materials deposited based on non-uniformity of the plasma produced at these frequencies. For example, VHF plasma may include an inherent standing wave effect generated by the VHF current used to form the plasma. The standing wave effect in the electro-magnetic field formed above the substrate being processed may cause the formed plasma to bend towards the substrate. This bending may occur near the edge of the substrate, which may cause differences in the ion trajectories and energies across the plasma, and some areas of the volume may include essentially no plasma, and hence lower deposition rates, or not deposit.

In some 3D NAND stacks, the pairs of initially deposited layers may include alternating layers of oxide and nitride, for example, while oxide deposition may be influenced more by temperature or gas flow, nitride may be more sensitive to plasma density or RF voltage. Accordingly, a compromise of processing conditions may not be feasible in conventional technologies, as affects implemented to improve one film deposition may cause an opposite impact on the other film being deposited. The present technology overcomes these challenges by utilizing one or more chamber components that may improve uniformity of deposition by controlling the standing wave effects produced by VHF plasma. By incorporating a ferrite structure within the processing chamber, the RF current imposed on the plasma may be modulated to reduce a plasma voltage effect. The ferrite may create an effect on the RF field and plasma distribution, and may redistribute the flux more uniformly through the volume. Accordingly, improved film formation may occur, and deposition uniformity may be improved at higher deposition rates facilitated by the VHF plasma.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
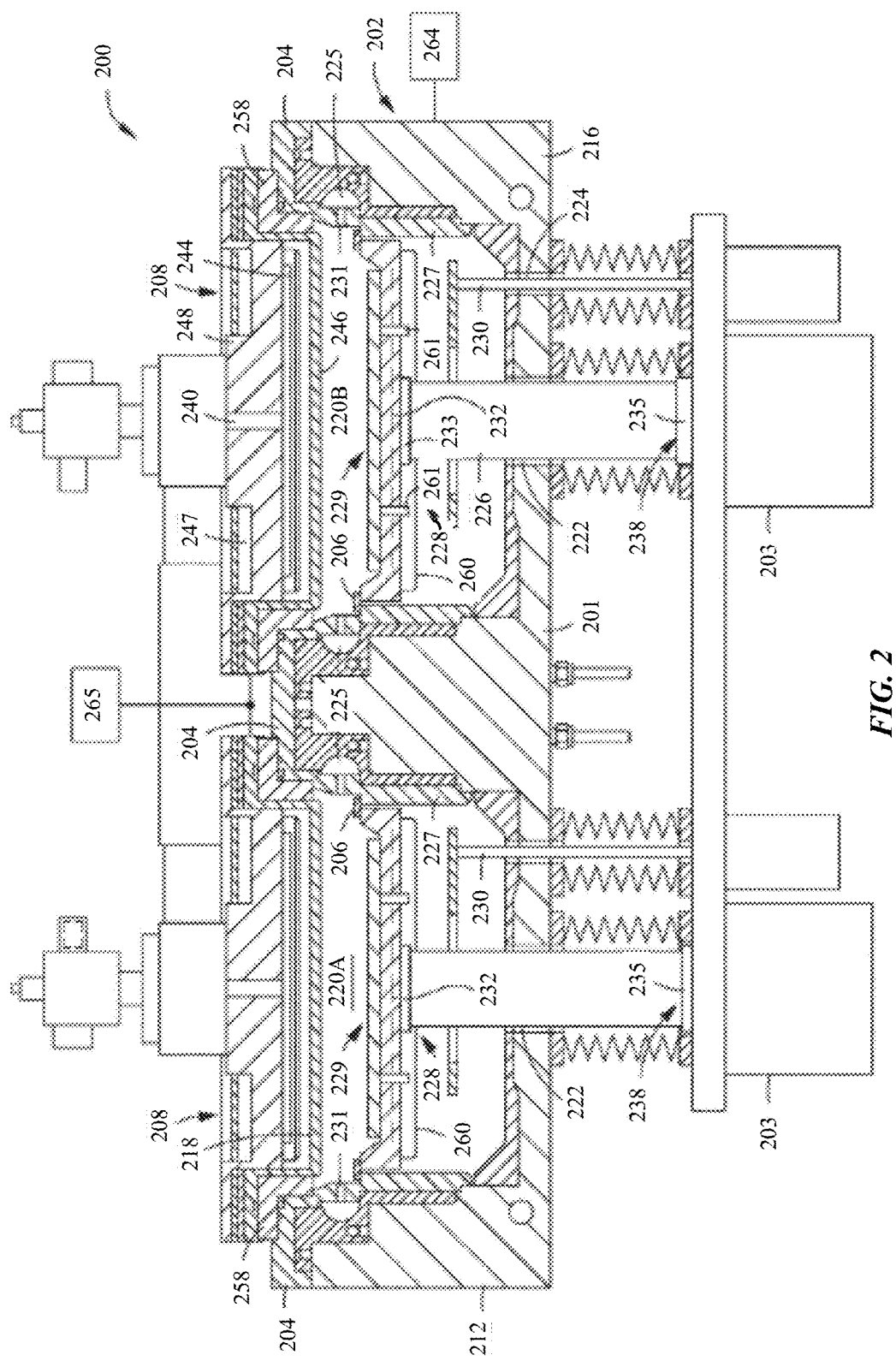
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
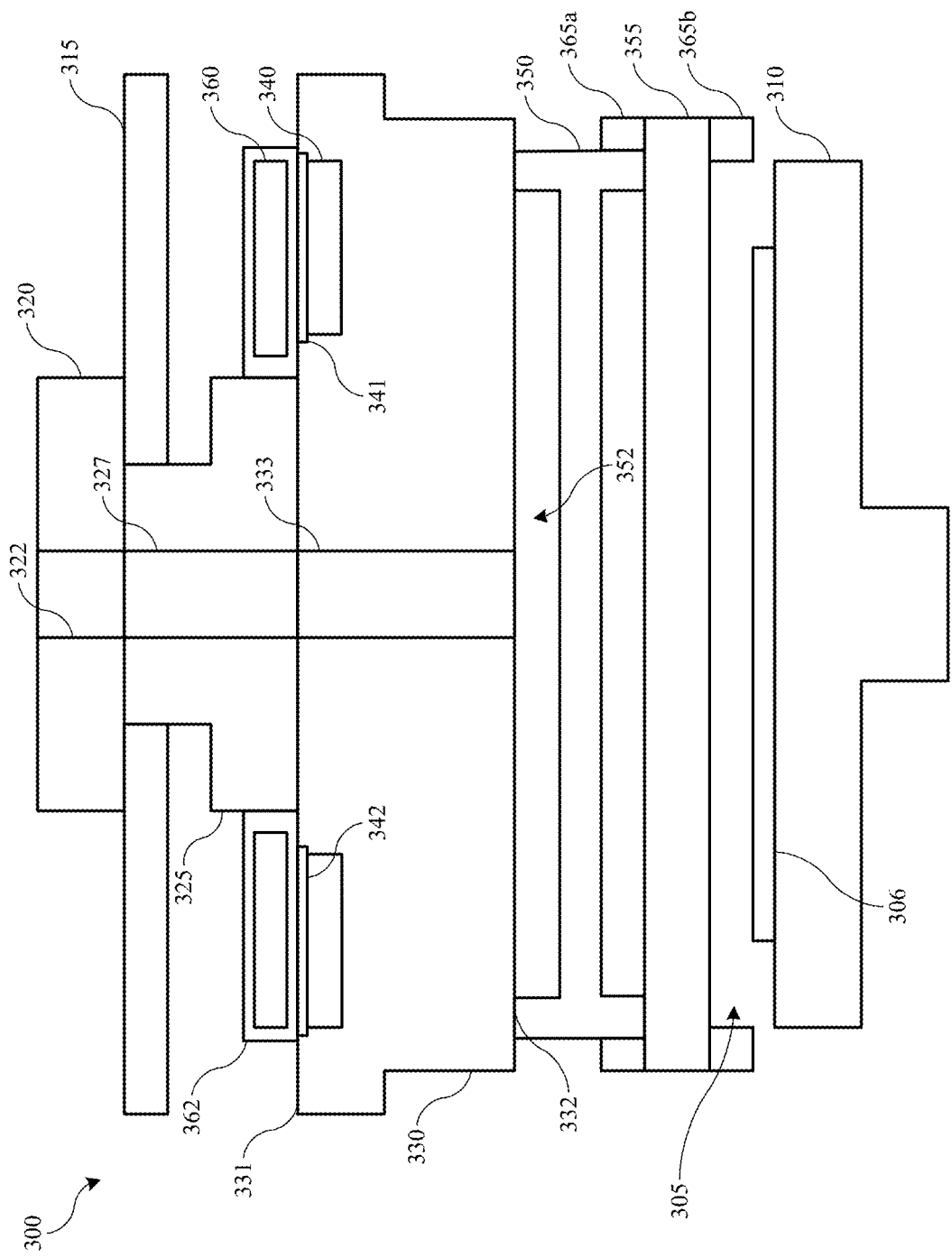
FIG. 3 shows a schematic partial cross-sectional view of an exemplary processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of materials as previously described, such as 3D NAND stacks, as well as other deposition, removal, and cleaning operations. Chamber 300 may show a partial view of a processing region of a semiconductor processing system, and may not include all of the components, such as a remote plasma unit as illustrated previously, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber into a processing region 305, such as where a substrate 306 may be positioned on a pedestal 310, for example. A chamber lid plate 315 may extend across one or more plates of the lid stack and may provide structural support for components, such as a remote plasma unit illustrated previously for system 200. The lid plate 315 may provide access, such as through an aperture, to an internal volume of processing chamber 300. An inlet manifold 320 may be positioned on the lid plate and may provide coupling with a remote plasma unit, which may provide precursors or plasma effluents for chamber cleaning or other processing operations. Inlet manifold 320 may define a central aperture 322, which may extend about a central axis of the chamber or inlet manifold. Processing chamber 300 may also include an insulator 325, which may electrically and/or thermally separate the inlet manifold from other lid stack components. Insulator 325 may also define a central aperture 327, which may be axially aligned with the central aperture 322 of the inlet manifold 320. Processing chamber 300 may also include a gasbox 330, on which the insulator may be positioned.

Gasbox 330 may be characterized by a first surface 331 and a second surface 332 that may be opposite the first surface. The gasbox may define a central aperture 333, which may extend fully through the gasbox from the first surface to the second surface. The central aperture 333 may be axially aligned with the central aperture of the inlet manifold 320, and may be axially aligned with the central aperture of the insulator 325. The apertures may define a channel, which may be at least partially used to deliver plasma effluents from a remote plasma unit positioned on the inlet manifold.

Gasbox 330 may include additional features. For example, gasbox 330 may define an annular channel 340, which may allow a cooling fluid to be flowed about the gasbox, and which may allow additional temperature control. As illustrated, the annular channel 340 may be defined in the first surface 331 of the gasbox 330. Annular channel 340 may extend about central aperture 333, and may also be concentric with the central aperture. A cover 342 may extend about the cooling channel to form a hermetic seal. For example, the gasbox may define a recessed ledge 341 in the first surface 331 of the gasbox extending about the annular channel. Cover 342, which may be characterized by an annular or other geometric shape, may be seated on the recessed ledge about the annular channel.

Semiconductor processing chamber 300 may also include additional components in some embodiments, such as a blocker plate 350, and a faceplate 355. Blocker plate 350 may define a number of apertures that may operate as a choke to increase radial diffusion to improve uniformity of delivery. As illustrated, a volume 352 may be formed or defined between the gasbox 330 and the blocker plate 350, which may allow an amount of lateral or radial diffusion of precursors prior to extending through the blocker plate. Faceplate 355 may then deliver precursors to the processing region, which may be at least partially defined from above by the faceplate.

As illustrated, gasbox 330 may be electrically coupled with blocker plate 350 and faceplate 355, which may be utilized as a plasma-generating electrode. In some embodiments, components of the lid stack may operate as a plasma-generating electrode, such as a hot electrode. The power source, such as an RF source 265 as previously described, may deliver power to the lid stack components, which may be electrically coupled with one another. For example, the RF source may couple with the gasbox in some embodiments, which may distribute power to the faceplate 355 where a plasma may be generated in processing region 305. In some embodiments the RF source may deliver power at any number of frequencies, and in some embodiments may deliver power at a high frequency, or very-high frequency, such as greater than or about 20 MHz, such as 27 MHz, greater than or about 40 MHz, greater than or about 60 MHz, or more. Unlike conventional technologies, which may create non-uniform plasma when operating at these frequencies, the present technology may incorporate components or be configured to improve the effects of VHF plasma power, which may produce more uniform plasma and deposition compared to conventional technologies.

For example, in some embodiments, the present technology may incorporate a ferrite block 360 in the lid stack. The ferrite block may be included or associated with the gasbox in some embodiments. For example, ferrite block 360 may be positioned between the lid plate 315 and the blocker plate 350, and may be positioned associated with the gasbox 330 in some embodiments. Ferrite block 360 may be in direct contact with the gasbox 330, such as seated directly on first surface 331 and/or cover 342, or may be included within a dielectric material 362 as illustrated. As will be described further below, the ferrite block may also be incorporated within the gasbox. Ferrite block 360 may be characterized by an annular shape, and may also extend about the central aperture 333 of the gasbox 330 as illustrated. The ferrite block may also be positioned to extend about the insulator 325. In additional embodiments as illustrated, a ferrite block may also be positioned seated above or below the faceplate, such as ferrite block 365a seated above the faceplate about the blocker plate, or 365b disposed beneath and in contact with the faceplate. Either or both of these may be incorporated along with ferrite block 360 in embodiments of the present technology, although in some embodiments blocks 365 may not be included.

Dielectric material 362 may be any dielectric material in which the ferrite block 360 may be incorporated. For example, dielectric material 362 may improve the structural integrity of the more fragile ferrite material, and may impact distribution of fields through the material. Accordingly, dielectric material 362 may be selected based on a dielectric constant of the material or based on mechanical properties of the material. For example, although ceramic or quartz materials may be used in some embodiments, these materials may similarly be more fragile and prone to damage. Additionally, these materials may be characterized by a higher dielectric constant, which may overcompensate an effect on the plasma, which may further adjust the field effect and reduce the plasma uniformity by further lowering the center profile, increasing non-uniformity of the deposition. Accordingly, in some embodiments the dielectric material may be or include a material characterized by a dielectric constant that is less than or about 3.8, and may be less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, less than or about 2.7, less than or about 2.6, less than or about 2.5, less than or about 2.4, less than or about 2.3, less than or about 2.2, less than or about 2.1, or less. Exemplary materials that may afford mechanical support for the ferrite as well as a lower dielectric constant may be polytetrafluoroethylene, polyether ether ketone or other polyaryletherketones, among any other material providing similar characteristics.

Ferrite block 360 may be or include a ferrite material, which may be or include iron, steel, nickel and/or zinc alloys, among any other number or combination of materials including ferromagnetic ceramic oxides for high frequency applications. The ferrite block 360 may have ferromagnetic properties, which may modulate the magnetic field component of the electromagnetic field induced by the RF current traveling through the lid stack components. The ferrite block may reduce or eliminate the magnetic field component of the electromagnetic field along a vertical direction through the chamber. The standing wave pattern in this vertical direction may then be extended outside of the ferrite blocks and may be narrowed inside the ferrite block. This may facilitate redistribution of the plasma flux, which may affect the plasma profile within the processing region of the chamber. For example, as noted previously, nitride deposition may occur with greater non-uniformity because of a stronger plasma voltage effect, which may induce deposition that may be much thicker in the center and have a radial profile across the substrate. By modulating the VHF plasma with ferrite incorporated as described throughout the present disclosure, the electric field may be spread away from the central location, which may cause the plasma to similarly spread further from the central location, and which may reduce the center-high deposition. As the plasma radial uniformity is increased within the processing region 305, the non-uniformity of the deposition may also be reduced, improving the overall deposition process.

Turning to FIG. 4 is shown a schematic cross-sectional view of an exemplary gasbox 330 according to some embodiments of the present technology. The figure may show additional details of the gasbox to illustrate incorporation of a ferrite block within the gasbox 330. As previously described, gasbox 330 may be characterized by a first surface 331, such as facing an inlet manifold, for example. Gasbox 330 may also be characterized by a second surface 332 opposite the first, and which may face a processing region, for example. Gasbox 330 may define a central aperture 333, and may define an annular channel 340, which may be defined in first surface 331, as previously described. A cover 342 may be coupled with the gasbox to seal the annular channel 340, which may allow a cooling fluid to be flowed through the channel in some embodiments. Gasbox 330 may also define a second annular channel 405 within the first surface 331, and within which may be seated the ferrite block 360. Second annular channel 405 may be formed about central aperture 333, and may be radially inward from first annular channel 340 as illustrated, although the channel locations may be reversed. However, by including annular channel 340 radially outward of the second annular channel, improved cooling may be afforded across the gasbox in some embodiments.

Gasbox 330 may be or include a conductive material in some embodiments, which may facilitate electrical operation of the gasbox as part of the powered electrode. Accordingly, in some embodiments, a dielectric spacer 410 may be included seated over the ferrite block 360. Were the ferrite fully housed within the gasbox, the gasbox may effectively shield the ferrite and limit or prevent any interaction with the RF fields. A cover 415 may be positioned over the dielectric spacer in some embodiments. Dielectric spacer 410 may form a gap between the cover 415 and the gasbox in some embodiments, as well as a gap between the cover 415 and the ferrite block 360. For example, dielectric spacer 410 may define a recess within which the cover 415 may be seated. A radial gap may then be formed between the gasbox and the inner annular surface and/or the outer annular surface of the cover 415. Consequently, cover 415 may not directly contact either ferrite block 360 or gasbox 330 in some embodiments. Additionally, cover 415 may include tabs or may extend radially to the gasbox along one side to allow coupling of the components in some embodiments. Dielectric spacer 410 may be any of the materials previously described, and the gaps created may be at least about 1 mm in some embodiments, and may be greater than or about 2 mm, greater than or about 3 mm, greater than or about 4 mm, greater than or about 5 mm, greater than or about 6 mm, greater than or about 7 mm, or more. Although illustrated with the ferrite block below the dielectric spacer, in some embodiments the spacer may be part of a dielectric material encompassing the ferrite block as previously described. A first surface of the dielectric material may extend further from the ferrite surface to form the recess in which the cover 415 may be seated.

FIG. 5A and FIG. 5B show schematic top views of exemplary ferrite block 360a and ferrite block 360b according to some embodiments of the present technology. The blocks may include any feature, component, or characteristic of ferrite blocks described previously, and may illustrate exemplary ferrite blocks that may be incorporated with processing chambers according to some embodiments of the present technology. Ferrite block 360a illustrates an embodiment where a single annular ferrite block is utilized, which may be included within dielectric material 362 as previously described. Ferrite block 360b illustrates an embodiment where a plurality of ferrite blocks are utilized, and may be included within dielectric material 362, such as formed about an annular shape, for example. It is to be understood that any number of ferrite blocks may be utilized in embodiments of the present technology, and may be characterized by any number of shapes.

Figure 6:
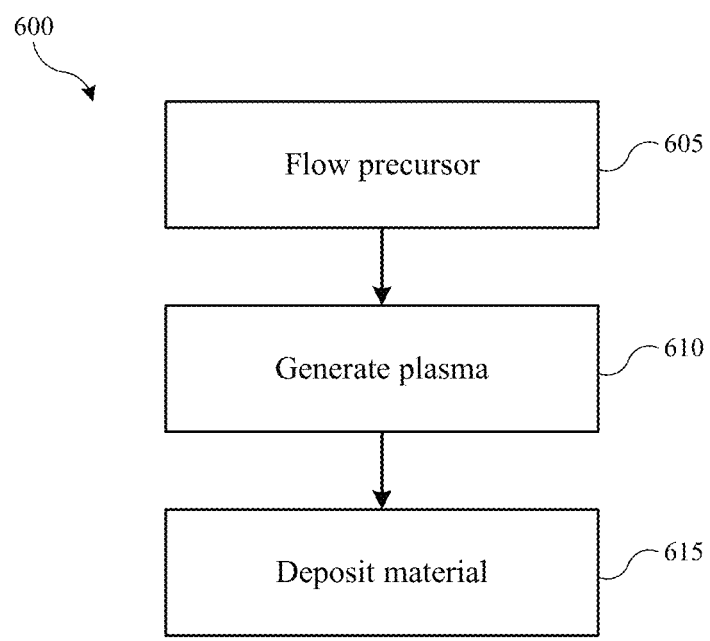
FIG. 6 shows operations of an exemplary method of semiconductor processing according to some embodiments of the present technology.

FIG. 6 shows operations of an exemplary method 600 of semiconductor processing according to some embodiments of the present technology. The method may be performed in a variety of processing chambers, including processing system 200 described above, or chamber 300, which may include gasboxes according to embodiments of the present technology, such as gasbox 330. Method 600 may include a number of optional operations, which may or may not be specifically associated with some embodiments of methods according to the present technology.

Method 600 may include a processing method that may include operations for forming a material film or other deposition operations at high frequency, such as producing stacks of 3D NAND films, which may be formed at a higher rate of deposition, and which may be produced with greater uniformity of deposition relative to conventional processes. The method may include optional operations prior to initiation of method 600, or the method may include additional operations. For example, method 600 may include operations performed in different orders than illustrated. In some embodiments, method 600 may include flowing one or more precursors into a processing chamber at operation 605. For example, the precursor may be flowed into a chamber, such as included in system 200, and then may be flowed through one or more of a gasbox, a blocker plate, or a faceplate as previously described, prior to delivering the precursor into a processing region of the chamber.

In some embodiments, the precursor may be or include a nitrogen-containing precursor for depositing a nitride layer, such as along with operations to utilize an oxygen-containing precursor for depositing an oxide layer. In some embodiments, a ferrite block may be included associated with the gasbox, or incorporated within the gasbox as previously described. Any of the other characteristics of gasboxes described previously may also be included, including any aspect of gasbox 330. At operation 610, a plasma may be generated of the precursors within the processing region, such as by providing RF power to the faceplate to generate a plasma. The plasma may be generated at any of the frequencies previously described, such as greater than or about 27 MHz, greater than or about 40 MHz, or greater. Material formed in the plasma may be deposited on the substrate at operation 615. In some embodiments, depending on the thickness of the material deposited, the deposited material may be characterized by a thickness at the center of the substrate that is less than or about 10% greater than a thickness proximate a mid or edge region along a radius of the substrate.

Additionally, the thickness at the center of the substrate may be less than or about 9% greater than a thickness proximate a mid or edge region along a radius of the substrate, and may be less than or about 8% greater, less than or about 7% greater, less than or about 6% greater, less than or about 5% greater, less than or about 4% greater, less than or about 3% greater, less than or about 2% greater, less than or about 1% greater, or may be substantially similar or uniform across positions along the substrate. By utilizing a ferrite block with high-frequency plasma deposition processes according to some embodiments of the present technology, deposition rates may be more than 50% greater than deposition performed at lower frequencies, while improving the plasma and deposition uniformity compared to conventional processing.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a block" includes a plurality of such blocks, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
   a substrate support positioned within a processing region of the semiconductor processing chamber;
   a lid plate;
   a gasbox positioned between the lid plate and the substrate support, the gasbox characterized by a first surface and a second surface opposite the first surface, wherein the gasbox defines a central aperture, wherein the gasbox defines an annular channel in the first surface of the gasbox extending about the central aperture through the gasbox, wherein the gasbox defines a recessed ledge in the first surface of the gasbox extending about the annular channel, and wherein the gasbox comprises an annular cover seated on the recessed ledge and extending across the annular channel defined in the first surface of the gasbox;
   a blocker plate positioned between the gasbox and the substrate support, wherein the blocker plate defines a plurality of apertures that operate as a choke for gas flowing therethrough;
   a ferrite block positioned between the lid plate and the blocker plate; and
   a faceplate positioned between the blocker plate and the substrate support.

2. The semiconductor processing chamber of claim 1, wherein the ferrite block is characterized by an annular shape extending about the central aperture of the gasbox.

3. The semiconductor processing chamber of claim 2, further comprising:
   an insulator positioned between the gasbox and the lid plate, wherein the insulator defines a central aperture axially aligned with the central aperture defined through the gasbox, and wherein the ferrite block extends about the insulator.

4. The semiconductor processing chamber of claim 1, wherein the ferrite block comprises a plurality of blocks extending about the gasbox.

5. The semiconductor processing chamber of claim 1, wherein the ferrite block is disposed within a dielectric material.

6. The semiconductor processing chamber of claim 5, wherein the dielectric material is characterized by a dielectric constant below or about 3.7.

7. The semiconductor processing chamber of claim 6, wherein the dielectric material comprises polytetrafluoroethylene or polyether ether ketone.

8. The semiconductor processing chamber of claim 1, wherein the gasbox defines a second annular channel within the gasbox, and wherein the ferrite block is seated within the second annular channel.

9. The semiconductor processing chamber of claim 8, wherein a dielectric spacer is positioned on the ferrite block seated within the second annular channel.

10. The semiconductor processing chamber of claim 9, wherein the dielectric spacer defines a recess within the dielectric spacer, and wherein a cover is seated within the recess within the dielectric spacer.

11. The semiconductor processing chamber of claim 10, wherein the dielectric spacer creates a vertical spacing between the cover and the ferrite block, and wherein the dielectric spacer creates a radial gap between the cover and the gasbox.

12. A semiconductor processing chamber comprising:
a substrate support positioned within a processing region of the semiconductor processing chamber;
a lid plate;
a gasbox positioned between the lid plate and the substrate support, the gasbox characterized by a first surface and a second surface opposite the first surface, wherein the gasbox defines a central aperture, wherein the gasbox defines an annular channel in the first surface of the gasbox extending about the central aperture through the gasbox, wherein the gasbox defines a recessed ledge in the first surface of the gasbox extending about the annular channel, and wherein the gasbox comprises an annular cover seated on the recessed ledge and extending across the annular channel defined in the first surface of the gasbox;
a ferrite block positioned between the lid plate and the gasbox;
a blocker plate positioned between the gasbox and the substrate support, wherein the blocker plate defines a plurality of apertures that operate as a choke for gas flowing therethrough; and
a faceplate positioned between the blocker plate and the substrate support.

13. The semiconductor processing chamber of claim 12, wherein the ferrite block is characterized by an annular shape extending about the central aperture of the gasbox.

14. The semiconductor processing chamber of claim 13, further comprising:
an insulator positioned between the gasbox and the lid plate, wherein the insulator defines a central aperture axially aligned with the central aperture defined through the gasbox, and wherein the ferrite block extends about the insulator.

15. The semiconductor processing chamber of claim 13, wherein the ferrite block comprises a plurality of blocks extending about the gasbox.

16. The semiconductor processing chamber of claim 12, wherein the ferrite block is disposed within a dielectric material, and wherein the dielectric material comprises polytetrafluoroethylene or polyether ether ketone.

17. The semiconductor processing chamber of claim 3, wherein the insulator extends along an entire vertical height of the ferrite block extends about the insulator.

18. The semiconductor processing chamber of claim 1, wherein the ferrite block is fully encased within a dielectric material that contacts an outer surface of the ferrite block.

19. The semiconductor processing chamber of claim 1, wherein:
the gasbox defines a second annular channel within the first surface of the gasbox;
the second annular channel is radially inward of the annular channel and extends partially through a thickness of the gasbox; and
the ferrite block is seated within the second annular channel.

20. The semiconductor processing chamber of claim 19, wherein:
a dielectric spacer is seated atop the ferrite block seated within the second annular channel;
the dielectric spacer defines a recess within the dielectric spacer, the recess being disposed on an opposite side of the dielectric spacer as the ferrite block;
a cover is seated within the recess within the dielectric spacer; and
the dielectric spacer creates a radial gap between the cover and the gasbox.

* * * * *